(12) United States Patent
Kaito

(10) Patent No.: US 7,235,783 B2
(45) Date of Patent: Jun. 26, 2007

(54) GAS BLOWING NOZZLE OF CHARGED PARTICLE BEAM APPARATUS AND CHARGED PARTICLE BEAM APPARATUS AS WELL AS WORKING METHOD

(75) Inventor: Takashi Kaito, Chiba (JP)

(73) Assignee: SII NanoTechnology Inc. (JP)

( * ) Notice: Subject to any disclaimer, the term of this patent is extended or adjusted under 35 U.S.C. 154(b) by 169 days.

(21) Appl. No.: 11/048,962

(22) Filed: Feb. 2, 2005

(65) Prior Publication Data

US 2005/0167614 A1 Aug. 4, 2005

(30) Foreign Application Priority Data

Feb. 4, 2004 (JP) ............................. 2004-027565
Jan. 31, 2005 (JP) ............................. 2005-023022

(51) Int. Cl.
*H01J 37/30* (2006.01)

(52) U.S. Cl. ................................... 250/310; 250/492.3
(58) Field of Classification Search .................... None
See application file for complete search history.

(56) References Cited

U.S. PATENT DOCUMENTS 6,555,815 B2 * 4/2003 Feuerbaum et al. ........ 250/310

* cited by examiner

*Primary Examiner*—David Vanore
(74) *Attorney, Agent, or Firm*—Adams & Wilks

(57) ABSTRACT

There are provided a gas blowing nozzle adapted such that, by the fact that a groove-like notch structure has been provided in a side to which a beam IB comes flying in a nozzle tip part of a gas gun used on the occasion of a beam assist deposition or a beam assist etching, the beam IB can pass through an inside of the notch structure, and a charged particle beam apparatus having the gas blowing nozzle 11 as well as a working method.

16 Claims, 4 Drawing Sheets

CONVENTIONAL

POSITION OF ION BEAM

GAS CONCENTRATION DISTRIBUTION

CONVENTIONAL POSITION OF ION BEAM

GAS CONCENTRATION DISTRIBUTION

PEAK POSITION $L = x + \dfrac{W}{2}$

GAS BLOWING NOZZLE OF CHARGED PARTICLE BEAM APPARATUS AND CHARGED PARTICLE BEAM APPARATUS AS WELL AS WORKING METHOD

BACKGROUND OF THE INVENTION

The present invention relates to a gas blowing nozzle of a charged particle beam apparatus for blowing an assist gas or a raw material gas to a sample face on the occasion of a beam assist etching or a beam assist deposition which uses a focussed ion beam or an electron beam, and a charged particle apparatus as well as a working method.

As a defect correction of a photomask used in a manufacturing process of LSI and a technique for creation-working a fine structure such as micromachine, there have been known the beam assist etching and the beam assist deposition (FIB-CVD) by a focussed ion beam (FIB) apparatus.

As shown in FIG. 4, as a general constitution, the FIB apparatus possesses an ion optical system for focussing an ion beam IB, which contains an ion source 14, a condenser lens 20, a beam blanker 21, an aligner 22, a stop 23, a sting meter/aligner 24, an objective lens 25 and the like, a deflector 16 for deflecting the ion beam IB, a gas gun 12, a secondary charged particle detector 17, and a sample stage 13 with a drive mechanism (not shown) for mounting a sample P. A working is performed by making a surface region P1 of the sample P to which the ion beam IB is irradiated into a predetermined gas atmosphere state by blowing a gas from a nozzle of the gas gun 12.

In the beam assist etching of the former, if the ion beam is irradiated to the sample face while blowing a halogen-based gas from the gas gun, an etching accompanying a chemical reaction between the sample and the gas is performed by the ion beam irradiation in the gas atmosphere. This etching is generally rapid in its etching speed by the fact that a substance generated by the reaction vaporizes, and has a characteristic that a residue like in a sputter etching does not remain.

Further, the beam assist deposition of the latter is one in which the ion beam is irradiated to the sample face under a state that a raw material gas has been jetted from the gas gun, and the raw material gas causes a decomposition reaction by being subjected to the beam irradiation, thereby forming a structure by depositing a product onto the sample face. There are known one in which a diamond-like carbon (DLC) is deposited to the sample face by using aromatic hydrocarbon such as phenanthrene: $C_{14}H_{10}$ as the raw material, one in which tungsten is deposited to the sample face by using hexacarbonyltungsten: $W(CO_6)$ for the raw material gas, and the like.

Since these reactions locally occur in a beam irradiation position, a fine etching working and a formation of the fine structure are possible by controlling the beam position, and they are used in the defect correction of the photomask used in an LSI manufacture and the formation of the micromachine or the like.

It is known that the gas nozzle of the gas gun used on these occasions is necessary to be disposed at a very short distance of 500 μm or less from the sample face in order to ensure a necessary gas concentration in a reaction region and, unless a concentration distribution is symmetrical with the beam irradiation position being made a center, the etching and the structure formation become unbalanced.

In this regard, as shown in FIG. 3A, it is known that in the gas concentration distribution on the sample surface under gas injection from a single gas nozzle 2a, the peak of the gas concentration is located around and right under the center of the end portion of the nozzle.

The conventional position of the ion beam irradiation is located away from the peak of the gas concentration distribution because the ion beam is blocked by the gas nozzle as shown in FIG. 3A. This results in a problem that the gas concentration distribution becomes asymmetrical with respect to the beam irradiation position and the symmetry of beam assist processing can not be secured.

As a method of solving this problem that the ion beam 5 does not reach the peak position of the gas concentration distribution, for example in Patent Document 1 (JP-A-2003-13226 Gazette (paragraph numbers 0037–0038, FIG. 3)), there is adopted the fact that a peak of the gas concentration is made in a center part of plural nozzle tip parts by using plural gas nozzles to thereby supplement mutual distributions. By doing like this, it is adapted so as to capable of sighting the beam center at the peak position of the gas concentration.

That is, as shown in FIG. 3B, in a case where 2 gas nozzles 2a are disposed so as to be opposed, the concentration distributions, shown by broken lines, of the gas jetted from the respective gas nozzles 2a are synthesized, and the gas distribution resultantly formed becomes such a normal distribution as shown by a solid line. In this case, it is possible to bring the peak position of the gas concentration to an intermediate position of both the nozzle 2a tip parts, and the ion beam 5 irradiation to the peak position becomes possible. So that, the symmetry of processing can be secured.

Further, there is known a gas delivery system (for example, refer to Patent Document 2 (JP-T-2000-512809 Gazette (FIG. 2) (the term "JP-T" as used herein means a published Japanese translation of a PCT patent application)) for a particle beam working, which can vertically deliver a fluid reactant (gas) to a work (base plate) in a particle beam (beam) irradiation position by utilizing a concentration device (inverted funnel tube in a vertical direction) provided in a tip of a fluid delivery conduit (gas nozzle).

According to this gas delivery system for the particle beam working, it is adapted such that, since the gas and the beam reach the work while passing through an inside of a passage formed in the same concentration device, the beam center can be sighted at the peak position of the gas concentration.

However, in the conventional one described in the above Patent Document 1 or 2 etc., there have been such problems as mentioned below.

That is, in a case where a nozzled is position form described in the above Patent Document 1 has been adopted, in an FIB working there occasionally occurs a necessity to perform the working by tilting the sample face, so that there arises a new disadvantage that, when it is attempted to implement the working, either of the nozzle tip parts butts against the sample face because a distance between the nozzle tip and the sample face is very short.

Further, similarly, as described in the above Patent Document 2, since it is necessary to locate the concentration device having the complicated shape near the sample face, there has arisen a problem that, when the sample face has been tilted, the concentration device interferes with the sample face. For this reason, it has been impossible to perform the beam assist deposition or the beam assist etching under a state that the sample has been slanted.

Further, similarly, as described in the above Patent Document 2, since it is necessary to locate the concentration device having the complicated shape near the sample face, there has arisen a problem that, when the sample face has been tilted, the concentration device interferes with the sample face. For this reason, it has been impossible to perform the beam assist deposition or the beam assist etching under a state that the sample has been slanted.

Further, there has been a fear that a detection efficiency of secondary electrons decreases because the concentration device influences. For this reason, at a small electric current time such as nano-working, it has been difficult to perform a sample observation etc. utilizing the secondary electrons.

Additionally, since the concentration device is long in a longitudinal direction vertical to the sample face, there has been a fear that, in a case where a gas whose concentration is high has been used, the beam is scattered and thus an influence is exerted upon working accuracy.

Incidentally, in the above explanations, although the deposition working has been made an example, also in a case of the beam assist etching it becomes a similar phenomenon and thus there arises a problem that an asymmetrical property of the etching working.

This invention is one made in view of the above problems of the prior art, and its object is to provide a gas blowing nozzle of a charged particle beam apparatus, which makes it possible, on the occasion of performing the beam assist deposition or the beam assist etching by using the charged particle beam apparatus, to perform a beam irradiation to the peak position of the gas concentration and can ensure the symmetrical property of that working without exerting an influence upon the drive of a sample stage and which exerts no influence upon the secondary electron detection efficiency and the working accuracy, and a charged particle beam apparatus as well as a working method.

SUMMARY OF THE INVENTION

In order to achieve the above objects, this invention is provided the following means.

A gas blowing nozzle of a charged particle beam apparatus of the present invention is one characterized by a notch structure provided in a side of the nozzel in the path in which the beam is directed to a nozzle tip part of a gas gun used on the occasion of a beam assist deposition or a beam assist etching, so that the beam can pass through an inside of the notch structure. As a concrete notch structure, there is provided one in which it is made in the form of a groove, a direction of the groove is in a nozzle longitudinal direction, a width of the groove is made a small dimension in comparison with a nozzle inner diameter, and a length of the groove has a value obtained by adding about ½ of a notch width to a distance from a nozzle tip to a peak position of a gas blowing density.

Further, a charged particle beam apparatus of the present invention is one characterized by possessing a gas blowing nozzle of a charged particle beam apparatus of the present invention, a stage mounting a sample, which is disposed below the gas blowing nozzle, a movement mechanism capable of moving the sample in X and Y directions parallel to a sample face, a beam source disposed above the sample and irradiating a charged particle beam toward the sample, a focussing optical system which is disposed between the beam source and the sample and focuses the charged particle beam onto the sample near the gas blowing nozzle, and a secondary charged particle detector detecting secondary charged particles having been discharged from the sample.

Further, a working method of the present invention is a working method performing a beam assist deposition or a beam assist etching by irradiating a charged particle beam to a sample under a state in a predetermined gas atmosphere by using a gas blowing nozzle of a charged particle beam apparatus according to the present invention, which possesses a peak position confirmation process of confirming a peak position of a gas blowing density of a gas gun by jetting a raw material gas, whose density is higher than a usual working time and which is under a state of being difficult to volatilize, from the gas blowing nozzle provided in a tip of the gas gun and microscope-observing a deposition state of the raw gas, and an irradiation process of jetting the predetermined gas from the gas blowing nozzle after the peak position confirmation process and irradiating the charged particle beam to the sample.

Additionally, it is one which, in a working method of the above present invention, possesses a position adjustment process of adjusting a position of the gas blowing nozzle such that the peak position, of the gas blowing density, confirmed after the peak position confirmation process is located in an irradiation position of the charged particle beam, and the irradiation process is performed after the position adjustment process.

DETAILED DESCRIPTION OF THE INVENTION

Hereunder, it is explained about one embodiment of a gas blowing nozzle and a charged particle beam apparatus as well as a working method, which concern the present invention, by referring to FIG. 1 and FIGS. 2A–2D.

In the present invention, when performing the beam assist deposition or the beam assist etching by using the charged particle beam apparatus, the use of plural gas nozzles has been eliminated in order not to exert an influence upon a drive of the sample stage, and it has been devised such that a working holding the symmetrical property can be performed under the gas concentration distribution made by one gas nozzle.

That is, the present inventors have noticed the fact that, in view of the fact that the beam irradiation is performed beyond a peak value in the concentration distribution as mentioned before is a cause, if a beam irradiation position can be set to a peak point vicinity of the gas concentration distribution, it is possible to expect to be capable of realizing an approximately symmetrical working. Whereupon, it has been adapted such that the beam is passed by providing a notch hole in one portion of an upper part of the nozzle tip to thereby basically notch that portion which has hither to become concealed by the nozzle and thus has been impossible to be used as a beam irradiation center, thereby making it possible to irradiate the beam, and its advantage has been confirmed.

Additionally, in the present invention, there has been added such a device that a gas flow in the nozzle whose inner diameter is about 500 µmφ is not influenced by the above notch.

More concrete explanations are made below.

Figure 1:
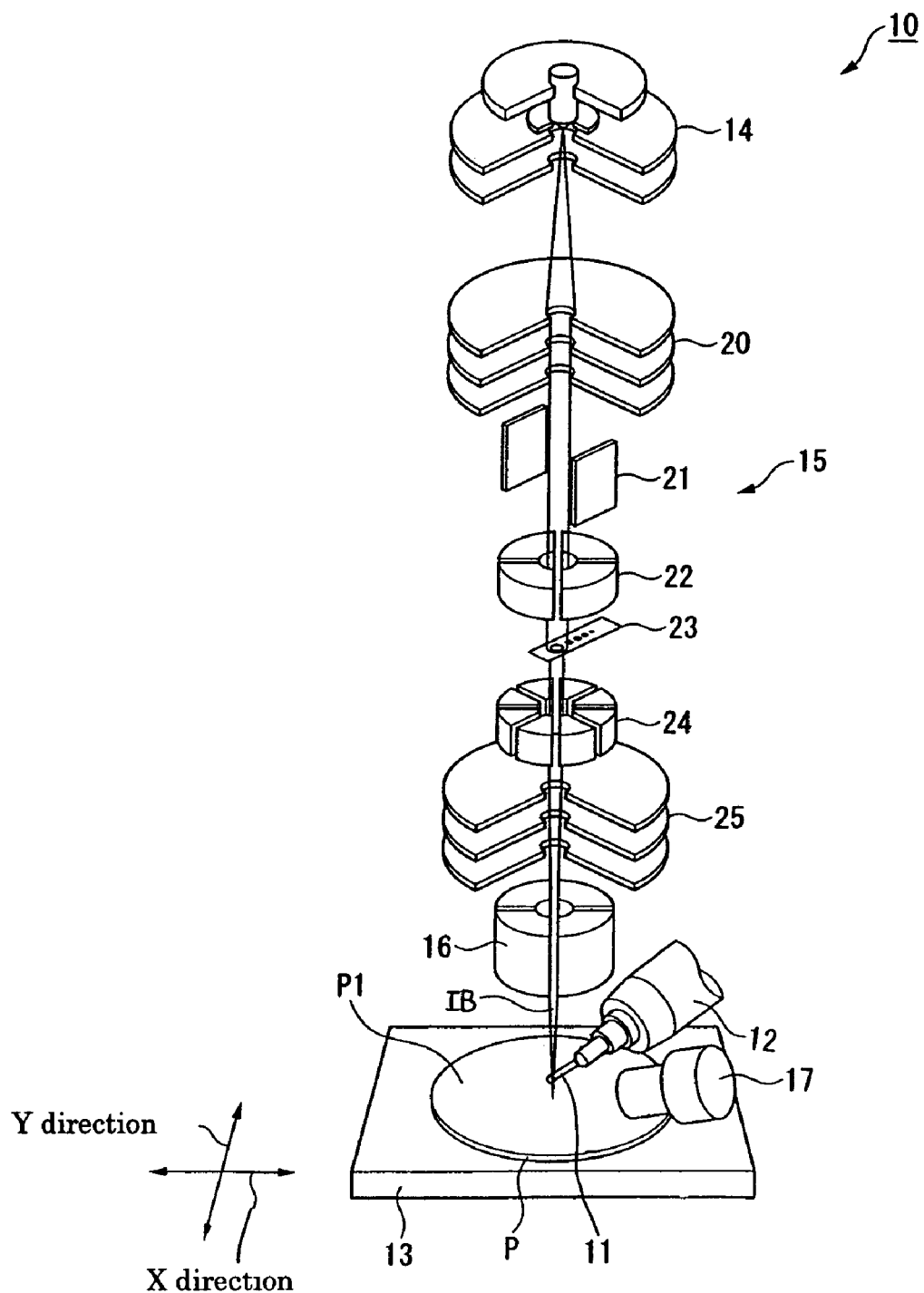
FIG. 1 is a constitutional diagram of one embodiment of a charged particle beam apparatus and a gas blowing nozzle, which concern the present invention.

As shown in FIG. 1, an FIB apparatus (charged particle beam apparatus) 10 of the present embodiment possesses a gas gun 12 having in its tip a gas nozzle (gas blowing nozzle) 11, a sample stage (stage) 13 mounting a sample P disposed below the gas nozzle 11, an ion source (beam source) 14 disposed above the sample P and irradiating an ion beam (charged particle beam) IB toward the sample P, an ion optical system (focussing optical system) 15 disposed between the ion source 14 and the sample P and focussing the ion beam IB onto the sample P in the vicinity of the gas nozzle 11, a deflector 16 disposed between the ion optical system 15 and the sample P and deflection-scanning the ion beam IB, and a secondary charged particle detector 17 detecting secondary charged particles discharged from the sample P.

The above the ion optical system 15 possesses, in order from the ion source 14 side, a condenser lens 20, a beam blanker 21, an aligner 22, a movable stop 23, a sting meter/aligner 24, and an objective lens 25. Further, the above sample stage 13 is made into a stage with a drive mechanism in which there is built a movement mechanism capable of moving the sample P in X and Y directions parallel to a sample face P1. Incidentally, not limited to this case, there may be adopted a movement mechanism moving the sample P in the X and Y directions by a piezoelectric element through the stage, and the like.

As shown in FIGS. 2A–2D, the gas nozzle 11 has a passage in the form of a notch structure S formed in a side portion or sidewall thereof, the passage being aligned with the path of the ion beam IB so that during beam assist deposition or beam assist etching, the ion beam IB can pass through the passage, i.e., through an inside of the notch structure S.

Further, in the present embodiment, the notch structure S is a groove, and one in which a direction of the groove is opened in a nozzle longitudinal direction.

Figure 2A:
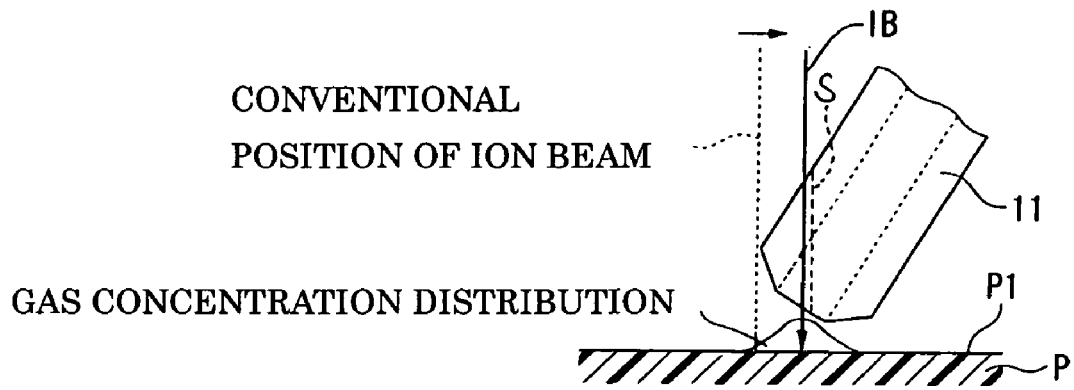
FIG. 2A is a diagram showing a relation between a gas concentration distribution and a beam path in the gas blowing nozzle shown in FIG. 1.

In other words, as shown in FIG. 2A, in a case where it is attempted to irradiate the ion beam IB to the peak position in the gas concentration distribution when the gas has been jetted from the gas nozzle 11, the beam irradiation to the above peak position is made possible by notching a tip part, of the gas nozzle 11, becoming an obstacle.

Figure 2B:
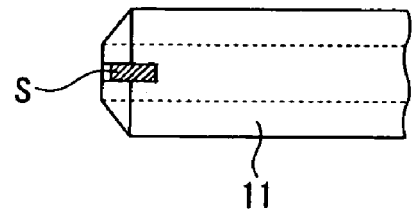
FIG. 2B is a diagram showing a tip part structure of the gas blowing nozzle.
Figure 2C:
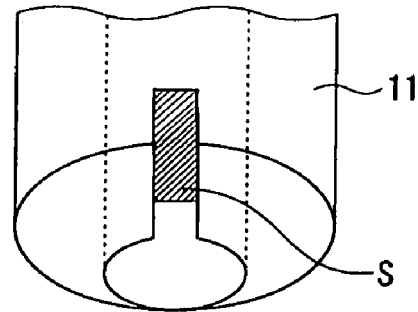
FIG. 2C is an enlarged diagram of a gas blowing nozzle tip part.
Figure 2D:
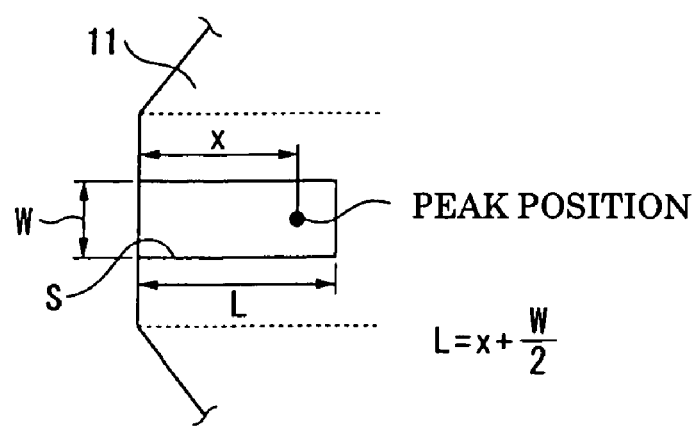
FIG. 2D is a diagram showing a relation between a length of a notch structure S and a peak position of a gas blowing density.
Figure 3A:
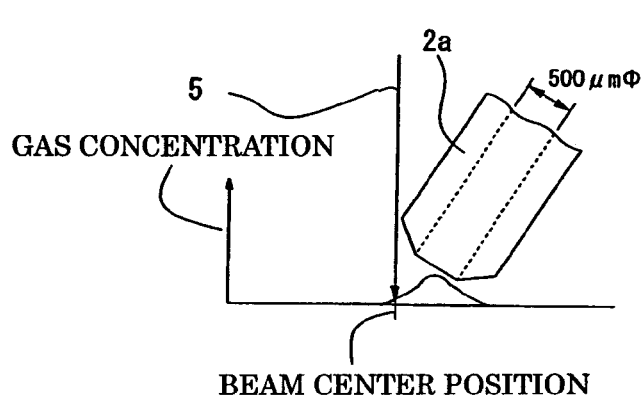
FIG. 3A is a diagram showing a gas concentration distribution state when a gas jetting has been performed by one gas nozzle, and FIG. 3B a gas concentration distribution state when the gas jetting has been performed by two opposed gas nozzles.
Figure 3B:
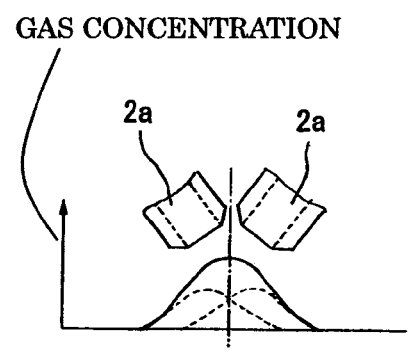
Figure 4:
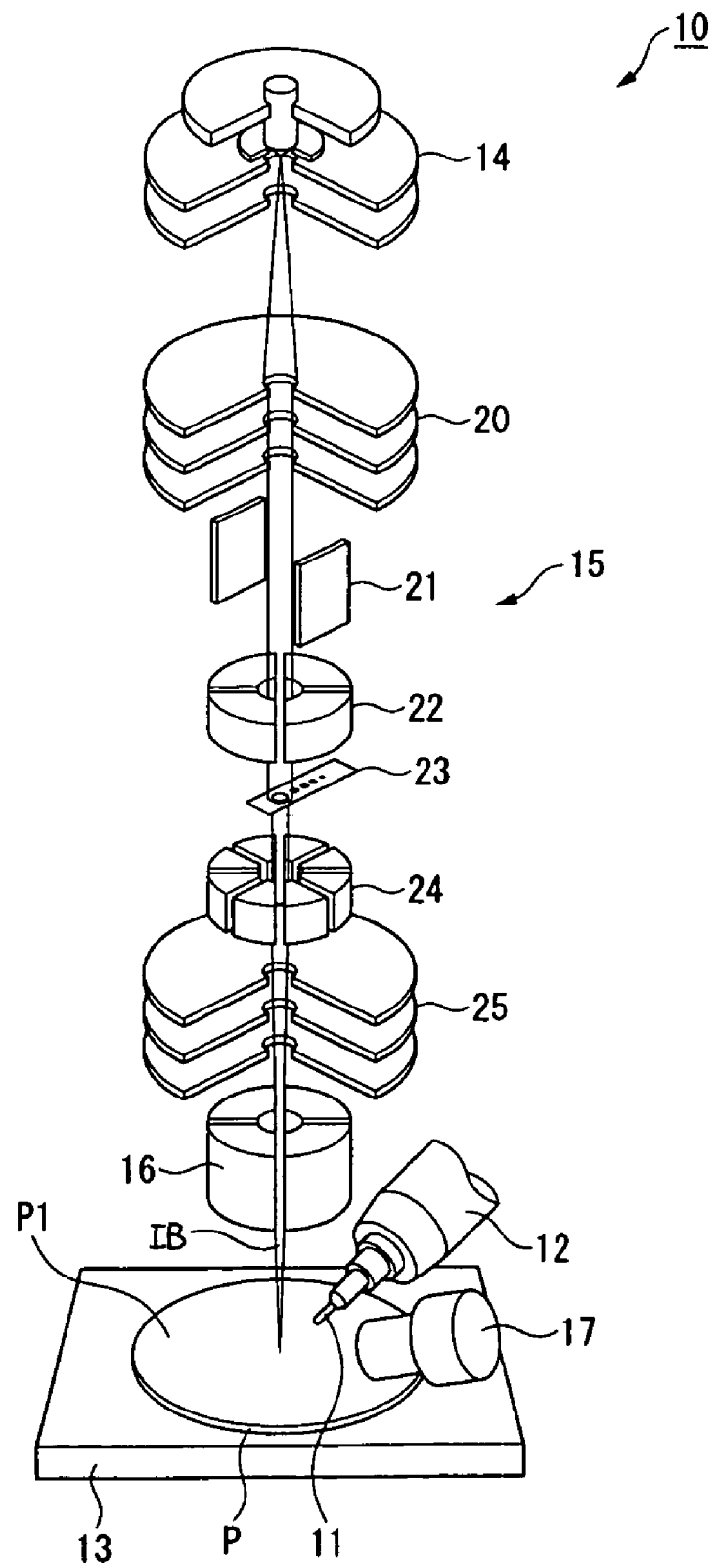
FIG. 4 is a diagram showing a conventional, general structure of a focussed ion beam apparatus possessing a gas gun.

This notch structure S has such a groove shape as shown in FIG. 2B seen from above and additionally in FIGS. 2C and 2D which are enlarged views of a portion of the former, and is one worked to, for example, a width (W) 100 µm and a length (nozzle longitudinal direction) (L) 200 µm symmetrically to a nozzle center line when seen from above.

As shown in FIG. 2A, since the gas nozzle 11 is disposed slantingly from above (i.e., inclined) with respect to the irradiation position of the ion beam IB, the notch structure S has the appearance of a chipped groove in a vertical direction coinciding with an irradiation direction of the ion beam 1B.

This working is performed by combining a machining and a finishing (polishing) working by the FIB. In comparison with the fact that the nozzle inner diameter at this time is 500 µm, since the notch width (W) has been made as small as 100 µm, an in-nozzle gas flow is not influenced by the fact that this notch structure S has been included, so that it has been possible to adapt so as to resultantly generate no substantial change in the concentration distribution of the gas blown.

Further, as shown in FIG. 2D, the width (W) of the groove of the notch structure S is a small dimension in comparison with the nozzle inner diameter, and the length (L) of the groove is set so as to become a value obtained by adding about ½ of the notch width (W) to a distance (X) from the nozzle tip to the peak position of the gas blowing density when seeing the nozzle from the ion source along the ion irradiation axis. This enables to secure the same scanning range in the groove longitudinal direction as that in the groove width direction.

It is explained hereunder about a case where the sample P is worked by the FIB apparatus 10 and the gas nozzle 11, which have been constituted like this.

First, the gas of each kind is jetted or directed from the gas nozzle 11 provided in the tip of the gas gun 12 toward the sample P mounted on the sample stage 13. Under this state, the ion beam IB is irradiated from the ion source 14, and the irradiated ion beam IB is focussed onto the sample P by the ion optical system 15. On this occasion, since the notch structure S is provided in the side of the gas nozzle 11 at the tip region thereof and aligned with the path of the ion beam IB, the ion beam IB is irradiated to the sample P in a gas atmosphere while passing through the notch structure S. In this manner, as shown in FIG. 2A, the ion beam IB is irradiated surely to the peak position of the gas concentration made by the one gas nozzle 11 without being subjected to the influence of the gas nozzle 11.

Therefore, it is possible to work the sample P while ensuring the symmetrical property with the ion beam IB being made the center. Further, by detecting the secondary charged particles discharged at this working time by means of the secondary charged particle detector 17, it is also possible to observe the worked region of the sample P, and the like.

Especially, since it is unnecessary to prepare the gas nozzle for exclusive use having the complicated shape and the notch structure S is merely provided in the conventional gas nozzle, it can be easily realized without incurring the labor and the manufacturing cost.

Incidentally, since the gas nozzle 11 is usually being electrically connected to the ground, when the ion beam IB passes inside the notch structure S, there is no fact that the ion beam IB is bent by being subjected to an influence of an electric charge electrified to the gas nozzle 11.

Further, since the notch structure S has the form of a slot groove, in which the direction of the groove is opened in the nozzle longitudinal direction and the groove width (W) is the small dimension in comparison with the nozzle inner diameter, a gas flow from the gas gun 12 is jetted under the state that the inherent in-tube flow form is held without being diffused by the notch structure S, so that the symmetrical property of the concentration distribution is not disturbed.

Further, since the length (L) of the groove is the value obtained by adding about ½ of the notch width (W) to the distance (X) from the nozzle tip to the peak position of the gas blowing concentration, it is possible to ensure a beam scanning range whose value is near to the notch width (W).

As mentioned above, by letting the ion beam IB pass so as to pass through the notch structure S, it has become possible to perform the working ensuring the symmetrical property by implementing the working in the vicinity of the peak point of the gas blowing density.

Further, in the above embodiment, although merely the ion beam IB has been irradiated, it is not limited to this. In other words, in the FIB apparatus 10 concerning the present invention, in which the above-mentioned gas nozzle 11 tip part has been notched, since the scanning of the beam irradiation position, which extends over a wide range from a region in which the gas concentration is low and which exists remotely seen from the gas nozzle 11 to a region in which the concentration becomes slightly low and which exists in this side beyond the peak point of the gas blowing density, is possible, there may be adopted a working method having a process of confirming the peak point of the gas blowing density by utilizing its function.

That is, the working method of the present embodiment is a method of performing the beam assist deposition or the beam assist etching by irradiating the ion beam IB to the sample P under a state in a predetermined gas atmosphere using the gas nozzle 11, and possesses a peak position confirmation process of confirming the peak position of the gas blowing density of the gas gun 12 by jetting a raw material gas, whose density is higher than a usual working time and which is under a state of being difficult to volatilize, from the gas nozzle 11 provided in the tip of the gas gun 12 and microscope-observing a deposition state of the raw gas, a position adjustment process of adjusting a position of the gas nozzle 11 such that the peak position, of the gas blowing density, confirmed by the peak position confirmation process is located in an irradiation position of the ion beam IB, and an irradiation process of jetting a predetermined gas from the gas nozzle 11 after the position adjustment process and irradiating the ion beam IB to the sample P.

First, as a method of confirming the peak point of the gas blowing density, there is performed the above peak position confirmation process of jetting the raw material gas, whose density is higher than the usual working time and which is under the state of being difficult to volatilize, from the gas nozzle 11 provided in the tip of the gas gun 12 and microscope-observing the deposition state of the raw gas.

In order to jet the raw material gas whose density is high, the high density raw material gas is jetted from the gas gun 12 by raising a temperature of a reservoir filled with the raw material gas such as phenanthrene to thereby make it into a pressurized state. A vapor pressure of the raw material gas becomes a function of a sample temperature. In the FIB-CVD, since the sample temperature is usually made a room temperature, it is possible to deposit the raw gas if it is made higher than the gas blowing density corresponding to the vapor pressure of the raw material gas.

Although the inventors heat the raw material gas in order to make it into the required gas blowing density, in this case it has been made into the high density by making a heating temperature higher by about 5–10° C. than that at a usual use time. If the high density gas is blown, on a sample face P1, since the raw material gas becomes a quantity more that it evaporates, it becomes a raw material gas deposition state as being raw intact. If that state is observed by an SIM image (ion induced secondary electron image), it seems black. Not limited to the ion beam IB, even in a case of an electron beam or a laser beam, it is possible to observe a situation of the deposition by a scanning microscope image.

Further, on this occasion, differing from the hitherto known concentration device and the like, since there is no fear that the secondary electron detection efficiency is reduced, it is possible to well observe the SIM image.

Incidentally, on the occasion of SIM-observing the deposition state, when it become necessary to ensure a wide visual field, it is good to shunt the nozzle by using a nozzle up/down function provided in the gas gun 12.

Like this, the present invention can observe an XY direction distribution state of the deposition by the microscope image by the beam scanning and, further, can specify a peak position of the deposit. If a value of the irradiated ion beam IB is the same, from the fact that a thickness of a deposition material deposited on that occasion is proportional to the raw material gas concentration, it follows that this deposition peak position shows the peak position in the gas concentration distribution.

Next, on the basis of this peak position information of the gas distribution with respect to the gas nozzle 11, if there is performed the position adjustment process of adjusting the gas nozzle 11 position such that the gas blowing density peak position coincides with a beam irradiation center, it is possible to determine the gas nozzle 11 position most suitable for the FIB working.

Incidentally, a Z direction position, of the nozzle, determining a distance between the nozzle tip and the sample face P1 is usually made a predetermined value between about 100–300 μm. In order to obtain a high gas density, although it is advantageous that the distance is short, this numerical value is a value determined by considering to avoid a danger that it collides if the distance is too short.

After the gas nozzle 11 position of the gas gun 12 has been adjusted by doing like this, when a symmetrical structure like a circular cylinder has been produced by the CVD working by means of the FIB apparatus 10 by performing the irradiation process, it has been possible to obtain a circular cylinder whose symmetrical property is good as aimed. Especially, differing from the hitherto known concentration device, since there is no fear that the ion beam IB is scattered, it is excellent in its workability.

Additionally, when carbon pillars by the FIB-CVD taking the same time have been produced in 4 directions near an outside of the circular cylinder, it has been possible to obtain the pillars whose heights are approximately equal.

Further, by the present invention, since it has become possible to perform the working using the peak point of the gas blowing density, it has been possible to obtain the growth rate which is equivalent to or higher than the case where the 2 opposed gas nozzles have been used even if the reservoir temperature is not additionally raised. This shows the fact that the utilization efficiency of the raw material gas has become 2 times or more, so that there has been obtained also an advantage that the exchange interval of the raw material, such as hexacarbonyltungsten, whose consumption is extreme can be prolonged.

Incidentally, a technical scope of the present invention is not limited to the above embodiment, and it is possible to add various modifications within a scope not deviating from a gist of the present invention.

For example, although the notch structure S has been explained as the groove, it is not limited to the groove shape. Further, the charged particle beam has been made the ion beam IB, it is not limited to the ion beam IB.

In the above embodiment, there is provided a groove in the gas nozzle, but it is possible to provide a through-hole in the gas nozzle so that the ion beam passes through the through-hole.

In a gas blowing nozzle of a charged particle beam apparatus of the present invention, since it is one in which the notch structure has been provided in the side to which the beam (charged particle beam) comes flying in the nozzle tip part of the gas gun used on the occasion of the beam assist deposition or the beam assist etching, the above portion becoming an obstacle of a beam path is notched, so that structurally the beam can pass through the inside of the notch concerned. Accordingly, it becomes possible to perform the beam irradiation to the peak position of the gas distribution having made by one nozzle, so that the working on that occasion can ensure the symmetrical property.

Further, in the present invention in which the notch structure is the groove, the direction of the groove is made one opened in the nozzle longitudinal direction and the groove width is made the small dimension in comparison with the nozzle inner diameter, by this constitution, since a gas flow from the gas gun is jetted under a state that an inherent in-tube flow form is held without being diffused by the notch structure, the symmetrical property of the concentration distribution is not disturbed.

Additionally, in the present invention, by the fact that the length of the groove is made the value obtained by adding about ½ of the notch width to the distance from the nozzle tip to the peak position of the gas blowing concentration, it is possible to ensure a beam scanning range whose value is near to the notch width.

Further, in a charged particle beam apparatus of the present invention, a gas of each kind is jetted from the gas blowing nozzle provided in the tip of the gas gun to the sample mounted on the stage, and the charged particle beam irradiated from the beam source is irradiated onto the sample under a state of being focussed by the focussing optical system. On this occasion, since the notch structure through which the charged particle beam can pass is provided in the side which is the tip of the gas blowing nozzle and to which the charged particle beam comes flying, the charged particle beam is irradiated surely to the peak position of the gas concentration distribution without being subjected to the influence of the nozzle. Therefore, it is possible to work the sample while ensuring the symmetrical property with the charged particle beam being made the center. Further, by detecting the secondary charged particles discharged at this working time by means of the secondary charged particle detector, it is also possible to observe a worked region of the sample, and the like.

Especially, since it is unnecessary to prepare a gas blowing nozzle (gas nozzle having the concentration device, and the like) for exclusive use having a complicated shape and the notch structure is merely provided by utilizing a conventional gas blowing nozzle, it can be easily realized without incurring a labor and a manufacturing cost.

Further, since the hitherto known concentration device is not used, there is no fear of reducing the secondary electron detection efficiency and, further, even if a gas whose concentration is high has been used, since it is unnecessary to scatter the charged particle beam, no influence is exerted upon the working accuracy.

Further, in a working method of the present invention, by the peak position confirmation process of jetting the raw material gas, whose density is higher than the usual working time and which is under the state of being difficult to volatilize, from the gas blowing nozzle to the sample face, it is possible to appropriately confirm the peak position of the gas blowing density by directly observing, before the raw material gas completely evaporates, its blowing distribution by a microscope image.

After the confirmation of the peak position, on the basis of a gas blowing density peak position information which could be confirmed by the above peak position confirmation process, there is performed the position adjustment process of adjusting the position of the gas blowing nozzle of the gas gun to an optimum position such that a charged particle beam irradiation position coincides with the peak position. By this, it is possible to appropriately determine a disposition of the gas gun, which can ensure the symmetrical property of the working.

And, after the position adjustment process, by irradiating the charged particle beam surely to the peak position of the gas blowing density, it is possible to perform the working of each kind such as the beam assist deposition or the beam assist etching.

Especially, since the notch structure is provided in the gas blowing nozzle, it is possible to perform the working ensuring the symmetrical property (with the charged particle beam being made the center). Further, since it is possible to perform the working which utilizes a peak point of the gas blowing density, it is possible to obtain a growth rate which is equivalent to or higher than a case where the conventional 2 opposed gas nozzles have been used even if a reservoir temperature is not additionally raised. Therefore, it is possible to increase a utilization efficiency of the raw material gas to thereby prolong a raw material exchange interval, so that it is possible to intend to reduce a cost.

What is claimed is:

1. A gas blowing nozzle of a charged particle beam apparatus, the gas blowing nozzle having a passage in a side portion thereof through which a charged particle beam passes during use of the gas blowing nozzle.

2. A gas blowing nozzle of a charged particle beam apparatus according to claim 1; wherein the passage is a notch structure provided in the side portion of the gas blowing nozzle such that the charged particle beam passes through an inside of the notch structure.

3. A gas blowing nozzle of a charged particle beam apparatus according to claim 2; wherein the notch structure is a groove, that extends lengthwise in a nozzle longitudinal direction.

4. A gas blowing nozzle of a charged particle beam apparatus according to claim 3; wherein a width of the groove is smaller than a nozzle inner diameter, and a length of the groove has a value obtained by adding about ½ of a notch width to a distance from a nozzle tip to a peak position of a gas blowing density.

5. A charged particle beam apparatus comprising:
a gas blowing nozzle of a charged particle beam apparatus as set forth in claim 3,
a sample stage disposed below the gas blowing nozzle for mounting a sample,
a movement mechanism capable of moving the sample stage in X and Y directions parallel to a sample face,
a beam source disposed above the sample stage for irradiating a charged particle beam toward the sample,
a focusing optical system disposed between the beam source and the sample stage and that focuses the charged particle beam onto the sample near the gas blowing nozzle, and
a secondary charged particle detector that detects secondary charged particles emitted from the sample.

6. A charged particle beam apparatus comprising:
a gas blowing nozzle of a charged particle beam apparatus as set forth in claim 4,
a sample stage disposed below the gas blowing nozzle for mounting a sample,
a movement mechanism capable of moving the sample stage in X and Y directions parallel to a sample face, a beam source disposed above the sample stage for irradiating a charged particle beam toward the sample, a focusing optical system disposed between the beam source and the sample stage and that focuses the charged particle beam onto the sample near the gas blowing nozzle, and a secondary charged particle detector that detects secondary charged particles emitted from the sample.

7. A charged particle beam apparatus comprising:

a gas blowing nozzle of a charged particle beam apparatus as set forth in claim 2, a sample stage disposed below the gas blowing nozzle for mounting a sample, a movement mechanism capable of moving the sample stage in X and Y directions parallel to a sample face, a beam source disposed above the sample stage for irradiating a charged particle beam toward the sample, a focusing optical system disposed between the beam source and the sample stage and that focuses the charged particle beam onto the sample near the gas blowing nozzle, and a secondary charged particle detector that detects secondary charged particles emitted from the sample.

8. A charged particle beam apparatus comprising:

a gas blowing nozzle of a charged particle beam apparatus as set forth in claim 1, a sample stage disposed below the gas blowing nozzle for mounting a sample, a movement mechanism capable of moving the sample stage in X and Y directions parallel to a sample face, a beam source disposed above the sample stage for irradiating a charged particle beam toward the sample, a focusing optical system disposed between the beam source and the sample stage and that focuses the charged particle beam onto the sample near the gas blowing nozzle, and a secondary charged particle detector that detects secondary charged particles emitted from the sample.

9. In a charged particle beam apparatus that irradiates a focused charged particle beam onto a sample: a gas blowing nozzle that directs a gas toward the sample at a region thereof being irradiated by the focused charged particle beam, the gas blowing nozzle extending into the path of the focused charged particle beam and having a passage aligned with the path and through which the focused charged particle beam passes before reaching the sample.

10. A charged particle beam apparatus according to claim 9; wherein the passage comprises a slot formed in a sidewall of the nozzle.

11. A charged particle beam apparatus according to claim 10; wherein the slot extends lengthwise along the nozzle.

12. A charged particle beam apparatus according to claim 11; wherein the slot terminates at one end near a tip of the nozzle.

13. A charged particle beam apparatus according to claim 12; wherein the one end of the slot terminates at and opens into the interior of the nozzle.

14. A charged particle beam apparatus according to claim 9; wherein the passage extends in a lengthwise direction along the nozzle.

15. A charged particle beam apparatus according to claim 14; wherein the passage terminates at one end near a tip of the nozzle.

16. A charged particle beam apparatus according to claim 15; wherein the one end of the passage terminates at and opens into the interior of the nozzle.

* * * * *